United States Patent
Seong et al.

(10) Patent No.: US 11,512,960 B2
(45) Date of Patent: Nov. 29, 2022

(54) METHOD OF CIRCULAR FRAME GENERATION FOR PATH ROUTING IN MULTILAYER STRUCTURE, AND COMPUTING DEVICE

(71) Applicant: SAMSUNG SDS CO., LTD., Seoul (KR)

(72) Inventors: Rak-Kyeong Seong, Seoul (KR); Chan-Ho Min, Seoul (KR)

(73) Assignee: SAMSUNG SDS CO., LTD., Seoul (KR)

( * ) Notice: Subject to any disclaimer, the term of this patent is extended or adjusted under 35 U.S.C. 154(b) by 165 days.

(21) Appl. No.: 16/665,794

(22) Filed: Oct. 28, 2019

(65) Prior Publication Data
US 2021/0003397 A1 Jan. 7, 2021

(30) Foreign Application Priority Data
Jul. 3, 2019 (KR) .......................... 10-2019-0079801

(51) Int. Cl.
*G01C 21/20* (2006.01)
(52) U.S. Cl.
CPC .................................. *G01C 21/20* (2013.01)
(58) Field of Classification Search
CPC ........ G06F 30/13; G06F 30/30; G06F 30/394; G06F 30/3947; G06F 17/00; G06F 30/39
(Continued)

(56) References Cited

U.S. PATENT DOCUMENTS 4,739,448 A * 4/1988 Rowe ...................... H01L 23/66
333/238
6,829,823 B2 * 12/2004 Downes, Jr. ........ H01L 21/4853
257/E23.062
(Continued)

FOREIGN PATENT DOCUMENTS

WO WO 03/001415 A1 * 1/2003 ............. G06F 17/50

OTHER PUBLICATIONS

Le-Chin Eugene Liu et al., "Multi-layer chip-level global routing using an efficient graph-based Steiner tree heuristic", European Design and Test Conference, 1997. ED&TC 97. Proceedings Paris, France Mar. 17-20, 1997, Los Alamitos, CA, USA,IEEE Comput. Soc, US, p. 311, 1997 (Year: 1997).*
(Continued)

*Primary Examiner* — Jeffrey P Aiello
(74) *Attorney, Agent, or Firm* — The PL Law Group, PLLC

(57) ABSTRACT

A method of path routing in a multilayered structure including layers and one or more links formed between adjacent layers includes identifying path connection elements included in each layer of a multilayered structure with layers that can have at least one links between adjacent layers, generating, for each layer of the multilayered structure, an embedded frame including the path connection elements identified in each layer of the multilayered structure, generating a topological frame including an outer boundary enclosing one or more punctures formed by the links among the plurality of path connection elements included in the embedded frame and one or more local path points arranged on a boundary of each of the one or more punctures, and generating a circular frame including a single circular closed curve by merging the boundary of each of the one or more punctures and the outer boundary of the topological frame.

13 Claims, 19 Drawing Sheets

(58) Field of Classification Search
USPC .......... 700/110; 702/36, 110, 117, 182–183, 702/185; 703/2, 6, 13
See application file for complete search history.

(56) References Cited

U.S. PATENT DOCUMENTS

2004/0211594 A1* 10/2004 Ho ..................... H05K 3/4007
174/264
2004/0212030 A1* 10/2004 Asai .................. G02B 6/12002
257/432

OTHER PUBLICATIONS

Rim C S et al., "Exact Algorithms for Multilayer Topological Via Minimization", IEEE Transactions on Computer Aided Design of Integrated Circuits and Systems, IEEE Service Center, Piscataway, NJ, US, vol. 8, (11), pp. 1165-1173, 1989 (Year: 1989).*
European Search Report for EP20162078.8 dated Sep. 1, 2020 from European patent office in a counterpart European patent application.
Rim C S et al., "Exact Algorithms for Multilayer Topological Via Minimization", IEEE Transactions on Computer Aided Design of Integrated Circuits and Systems, IEEE Service Center, Piscataway, NJ, US, vol. 8, (11), pp. 1165-1173, 1989.
Le-Chin Eugene Liu et al., "Multi-layer chip-level global routing using an efficient graph-based Steiner tree heuristic", European Design and Test Conference, 1997. ED&TC 97. Proceedings Paris, France Mar. 17-20, 1997, Los Alamitos, CA, USA,IEEE Comput. Soc, US, p. 311, 1997.

* cited by examiner

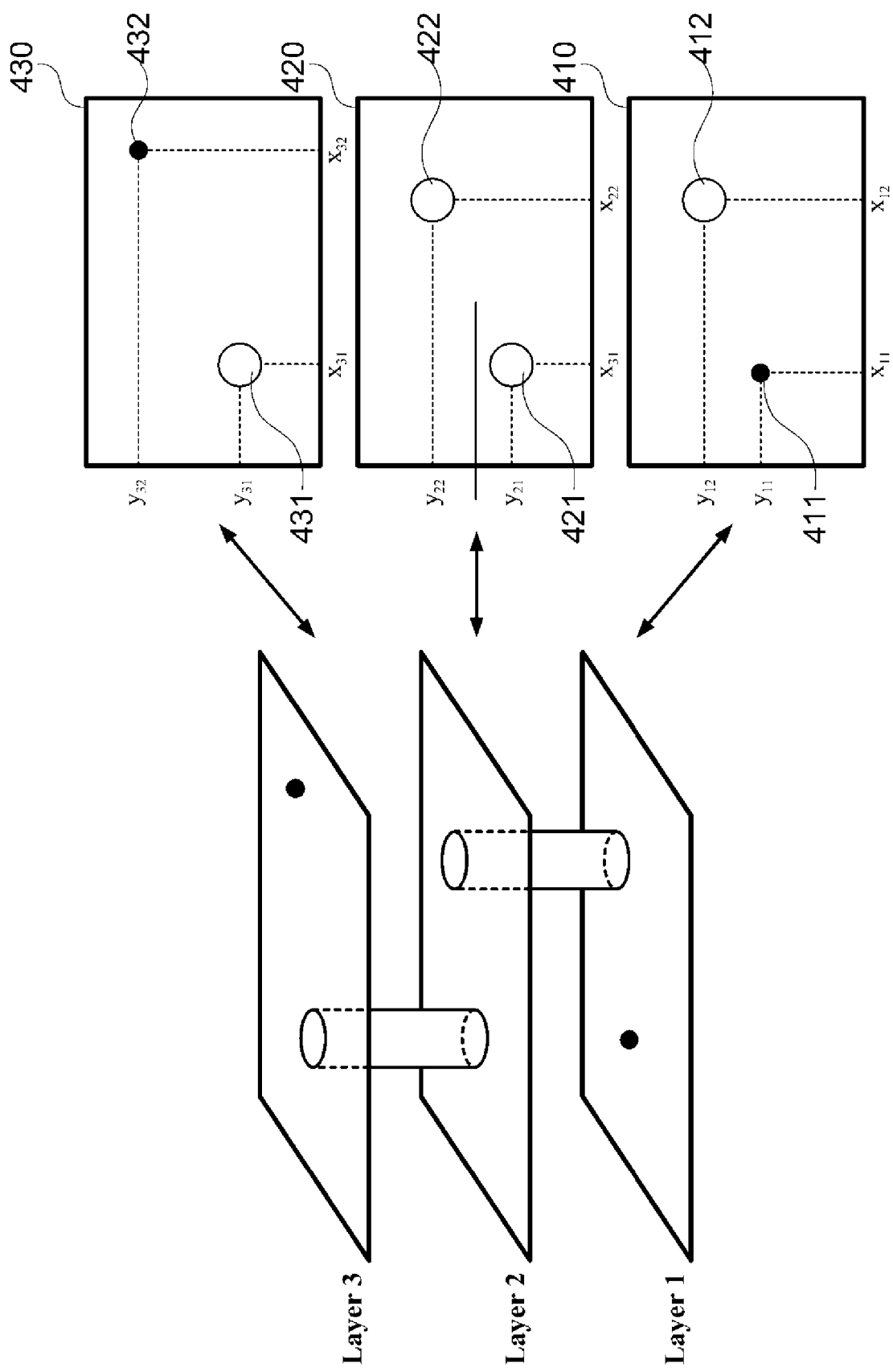

METHOD OF CIRCULAR FRAME GENERATION FOR PATH ROUTING IN MULTILAYER STRUCTURE, AND COMPUTING DEVICE

CROSS REFERENCE TO RELATED APPLICATIONS AND CLAIM OF PRIORITY

This application claims the benefit of Korean Patent Application No. 10-2019-0079801 filed on Jul. 3, 2019 in the Korean Intellectual Property Office, the disclosure of which is incorporated herein by reference in its entirety.

TECHNICAL FIELD

The following description relates to path routing technology.

BACKGROUND ART

In the past, various algorithms such as Dijkstra's algorithm were proposed for calculating an optimal path between two points. However, when conventional algorithms are used to calculate optimal paths in a multilayered structure, the computation becomes increasingly more complicated with more time spent for the computation when the number of layers and path start and end points increases. Therefore, there is a need for a method for effectively calculating optimal paths for a complicated multilayered structure.

SUMMARY

The disclosed embodiments are intended to provide a method of generating a circular frame for path routing in a multilayered structure.

According to one embodiment, a method of generating a circular frame, which is performed on a computing device comprising one or more processors and a memory storing one or more programs that can be executed by the one or more processors, includes: identifying a plurality of path connection elements included in each layer of a multilayered structure including a plurality of layers and one or more links formed between adjacent layers; generating, for each layer of the multilayered structure, an embedded frame including the plurality of path connection elements identified in each layer of the multilayered structure; generating a topological frame including an outer boundary enclosing one or more punctures formed by the one or more links among the plurality of path connection elements included in the embedded frame and one or more local path points arranged on a boundary of each of the one or more punctures; and generating a circular frame composed of a circular closed curve by merging the boundary of each of the one or more punctures and the outer boundary of the topological frame.

The plurality of identified path connection elements may include one or more global path points.

The generating of the topological frame may include generating the outer boundary enclosing the one or more punctures and projecting the one or more global path points onto the outer boundary.

The projecting of the one or more global path points may include setting one or more straight lines connecting an arbitrary point in an interior of the embedded frame and each of the one or more global path points and projecting the one or more global path points along the one or more straight lines onto the outer boundary.

The one or more global path points and the one or more local path points may each be arranged on the circular closed curve.

The generating of the circular frame may include setting, on the topological frame, one or more reference paths, each of which has one end connected to a boundary of one of the one or more punctures and the other end connected to a boundary of another puncture or to the outer boundary of the topological frame, and merging the boundary of each of the one or more punctures and the outer boundary of the topological frame into the circular closed curve by cutting the topological frame along the one or more reference paths.

The circular frame may include a pair of reference points each of which corresponds to each of the one or more reference paths and is arranged on the circular closed curve.

According to one embodiment, a computing device includes one or more processors and a memory storing one or more programs that can be executed by the one or more processors, wherein the programs include commands to perform operations comprising: identifying a plurality of path connection elements included in each layer of a multilayered structure including a plurality of layers and one or more links formed between adjacent layers; generating, for each layer of the multilayered structure, an embedded frame including the plurality of path connection elements identified in each layer of the multilayered structure; generating a topological frame including an outer boundary enclosing one or more punctures formed by the one or more links among the plurality of path connection elements included in the embedded frame and one or more local path points arranged on a boundary of each of the one or more punctures; and generating a circular frame composed of a circular closed curve by merging the boundary of each of the one or more punctures and the outer boundary of the topological frame.

The plurality of identified path connection elements may include one or more global path points.

The generating of the topological frame may include generating the outer boundary enclosing the one or more punctures and projecting the one or more global path points onto the outer boundary.

The projecting of the one or more global path points may include setting one or more straight lines connecting an arbitrary point in an interior of the embedded frame and each of the one or more global path points and projecting the one or more global path points along the one or more straight lines onto the outer boundary.

The one or more global path points and the one or more local path points may each be arranged on the circular closed curve.

The generating of the circular frame may include setting, on the topological frame, one or more reference paths, each of which has one end connected to a boundary of one of the one or more punctures and the other end connected to a boundary of another puncture or to the outer boundary of the topological frame, and merging the boundary of each of the one or more punctures and the outer boundary of the topological frame into the circular closed curve by cutting the topological frame along the one or more reference paths.

The circular frame may include a pair of reference points each of which corresponds to each of the one or more reference paths and is arranged on the circular closed curve.

According to the embodiments of the present disclosure, each of the layers of a multilayered structure composed of a plurality of layers may be represented as a circular frame so that the problem of finding a path in the multilayered structure can be transformed into a simple problem of connecting a straight line between points disposed on a circular boundary. Therefore, effective path computation is possible even when the number of layers included in the multilayered structure and the number of path start and end points increase.

BRIEF DESCRIPTION OF THE DRAWINGS

FIG. 4 is a diagram illustrating an example of the embedded frame for each layer of a multilayered structure.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art.

Descriptions of well-known functions and constructions may be omitted for increased clarity and conciseness. Also, terms described below are selected by considering functions in the embodiment and meanings may vary depending on, for example, a user or operator's intentions or customs. Therefore, definitions of the terms should be made on the basis of the overall context. The terminology used in the detailed description is provided only to describe embodiments of the present disclosure and not for purposes of limitation. Unless the context clearly indicates otherwise, the singular forms include the plural forms. It should be understood that the terms "comprises" or "includes" specify some features, numbers, steps, operations, elements, and/or combinations thereof when used herein, but do not preclude the presence or possibility of one or more other features, numbers, steps, operations, elements, and/or combinations thereof in addition to the description.

Figure 1:
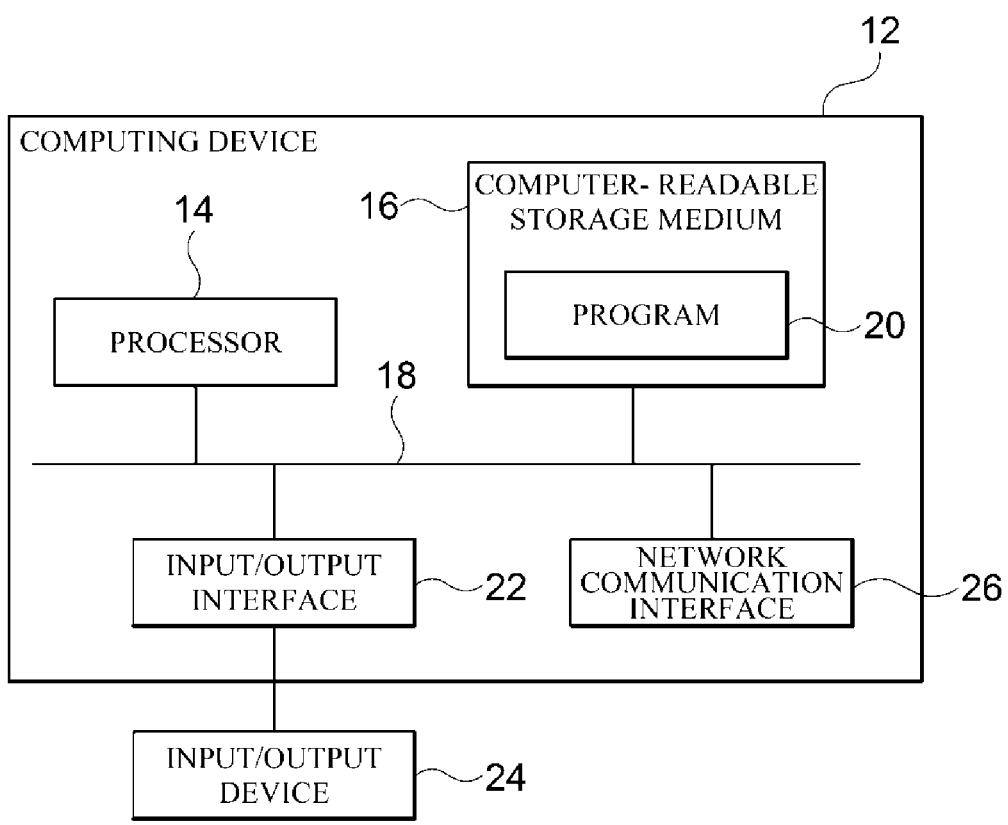
FIG. 1 is a block diagram describing a computing environment including a computing device suitable to be used in exemplary embodiments.

FIG. 1 is a block diagram describing a computing environment 10 including a computing device suitable to be used in exemplary embodiments. In the illustrated embodiments, each of the components may have functions and capabilities different from those described hereinafter and additional components may be included in addition to the components described herein.

The illustrated computing environment 10 includes a computing device 12. In one embodiment, the computing device 12 may be, for example, an apparatus for performing a method of generating the circular frame according to embodiments of the present invention.

The computing device 12 may include at least one processor 14, a computer-readable storage medium 16, and a communication bus 18. The processor 14 may cause the computing device 12 to operate according to exemplary embodiments that will be described below. For example, the processor 14 may execute one or more programs stored in the computer-readable storage medium 16. The one or more programs may include one or more computer executable commands, and the computer executable commands may be configured to, when executed by the processor 14, cause the computing device 12 to perform operations according to the exemplary embodiment.

The computer readable storage medium 16 is configured to store computer executable commands and program codes, program data and/or information in other suitable forms. The program 20 stored in the computer readable storage medium 16 may include a set of commands executable by the processor 14. In one embodiment, the computer readable storage medium 16 may be computer memory (volatile memory, such as random access memory (RAM), non-volatile memory, or a combination thereof), one or more magnetic disk storage devices, optical disk storage devices, flash memory devices, storage media in other forms capable of being accessed by the computing device 12 and storing desired information, or a combination thereof.

The communication bus 18 connects various other components of the computing device 12 including the processor 14 and the computer readable storage medium 16.

The computing device 12 may include one or more input/output interfaces 22 for one or more input/output devices 24 and one or more network communication interfaces 26. The input/output interface 22 and the network communication interface 26 are connected to the communication bus 18. The input/output device 24 may be connected to other components of the computing device 12 through the input/output interface 22. The input/output device 24 may be, for example, a pointing device (a mouse, a track pad, or the like), a keyboard, a touch input device (a touch pad, a touch screen, or the like), an input device, such as a voice or sound input device, various types of sensor devices, and/or a photographing device, and/or an output device, such as a display device, a printer, a speaker, and/or a network card. The input/output device 24 may be included inside the computing device 12 as one component constituting the computing device 12 or may be connected to the computing device 12 as a device separate from the computing device 12.

Figure 2:
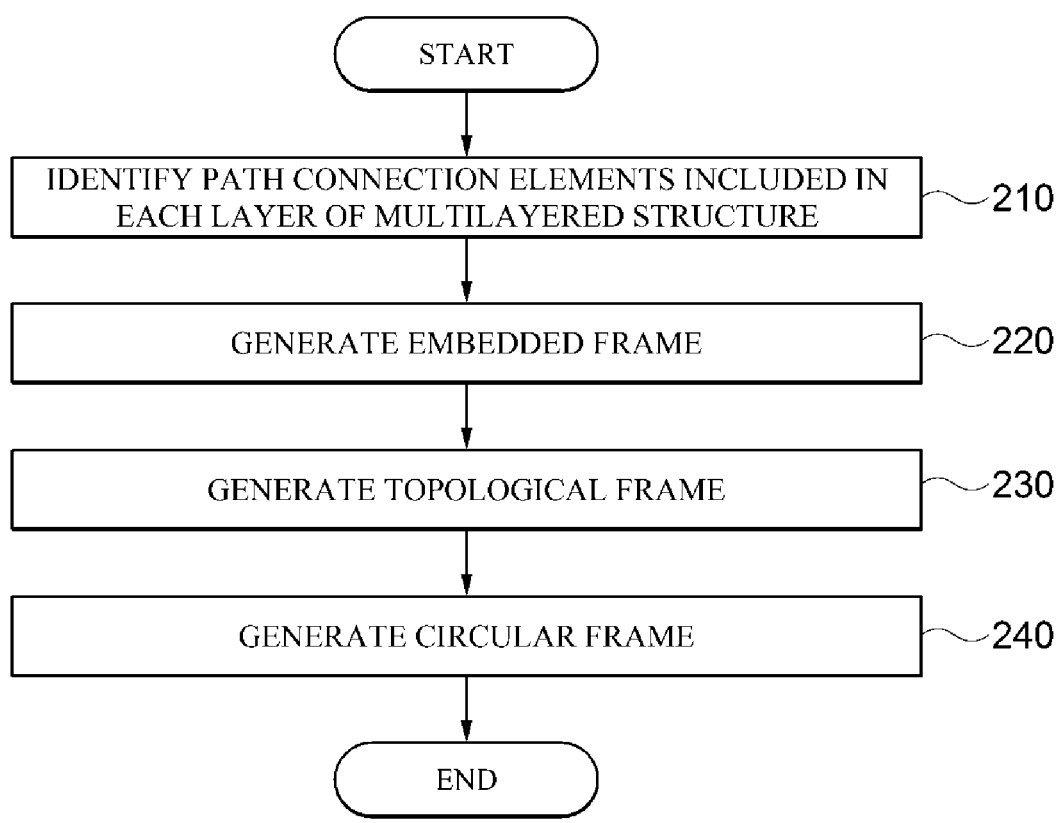
FIG. 2 is a flowchart illustrating a method of generating the circular frame according to one embodiment.

FIG. 2 is a flowchart illustrating a method of generating the circular frame according to one embodiment.

The method shown in FIG. 2 may be performed by, for example, the computing device 12 shown in FIG. 1.

Referring to FIG. 2, the computing device 12 identifies a plurality of path connection elements included in each of the layers of a multilayered structure that is to be transformed (210).

In an embodiment of the present disclosure, the multilayered structure refers to a three-dimensional structure including a plurality of layers and one or more links formed between adjacent layers. For example, the multilayered structure may be a building with several floors, a printed circuit board (PCB), a semiconductor chip, or the like, but is not necessarily limited thereto.

A link refers to a connecting passage passing through two adjacent layers in a multilayered structure. For example, in a case where the multilayered structure is a building, a link may be a staircase or an elevator. In another example, in a case where the multilayered structure is a PCB or a semiconductor chip, a link may be a via-hole formed to connect wirings of adjacent layers.

In one embodiment, the path connection elements may include global path points and punctures formed on each layer by a link. In this case, the global path points may include a global path start point and a global path end point at which a path starting from the global path start point ends. Meanwhile, a global path refers to a path connecting a global path start point and a global path end point.

Figure 3:
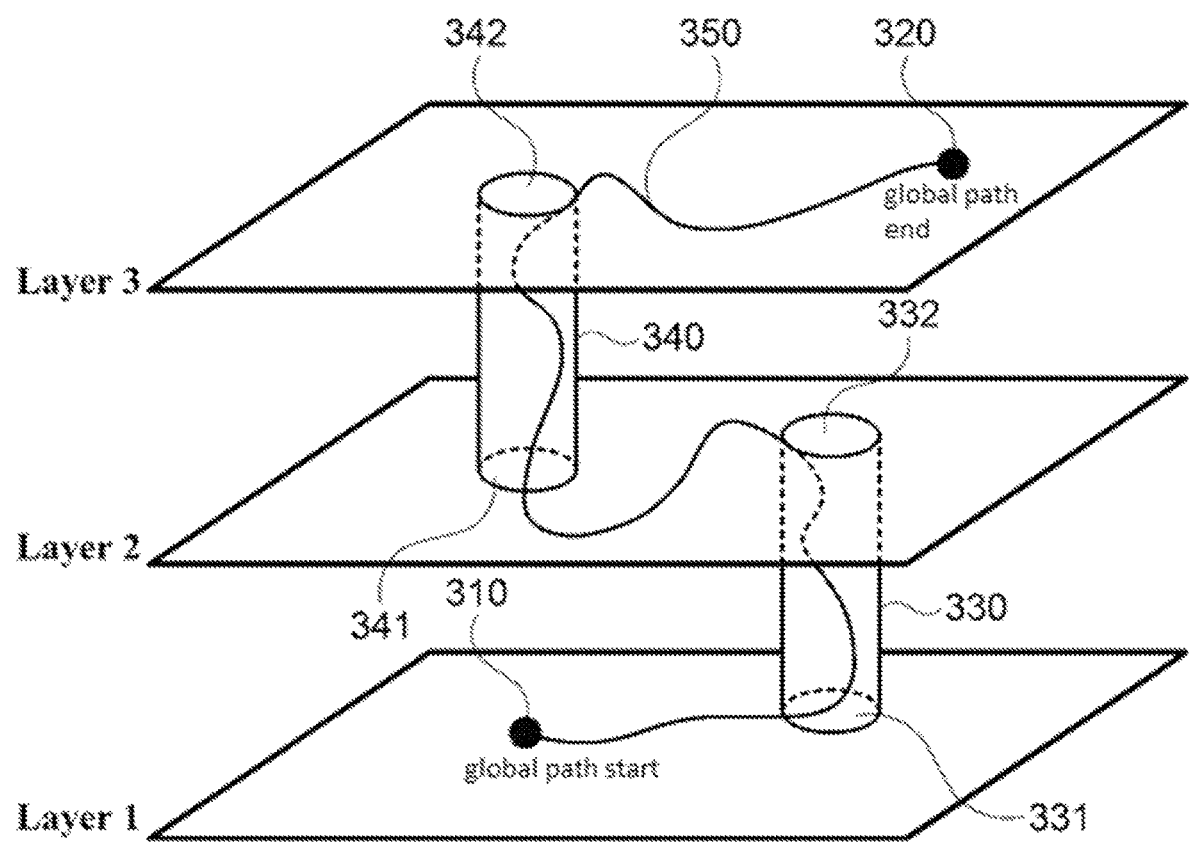
FIG. 3 is a diagram illustrating an example of a multilayered structure according to one embodiment.

FIG. 3 is a diagram illustrating an example of a multilayered structure according to one embodiment.

The illustrative multilayered structure 300 shown in FIG. 3 includes three layers, Layer 1, Layer 2, and Layer 3, where a global path start point 310 is located in Layer 1, which is the lowermost layer, and a global path end point 320 is located in Layer 3, which is the uppermost layer.

Also, in the multilayered structure 300, one link 330 is formed between Layer 1 and Layer 2 and another link 340 is formed between Layer 2 and Layer 3. Accordingly, Layer 1 includes a puncture 331 formed by the link 330 connected to Layer 2, and Layer 2 includes a puncture 332 formed by the link 330 connected to Layer 1 and a puncture 341 formed by the link 340 connected to Layer 3. Also, Layer 3 includes a puncture 342 formed by the link 340 connected to Layer 2.

Consequently, in the example shown in FIG. 3, path connection elements identified at Layer 2 are the global path start point 310 and one puncture 331, and path connection elements identified at Layer 2 are two punctures 332 and 341. Also, path connection elements identified at Layer 3 are one puncture 342 and the global path end point 320.

In the example illustrated in FIG. 3, it is illustrated that the multilayered structure 300 includes one global path start point 310 and one global path end point 320, but one or more global path start points and one or more global path end points may exist in the multilayered structure according to an embodiment, and each of the one or more global path start points and the one or more global path end points may be positioned at a different layer in the multilayered structure, or some of the global path start and end points may be positioned at the same layer.

In addition, in the example illustrated in FIG. 3, one link 330 and 340 is formed between every two adjacent layers in the multilayered structure 300, but more than one link may be formed between adjacent layers according to an embodiment.

Referring back to FIG. 2, the computing device 12 identifies the path connection elements included in each layer and generates the embedded frame for each layer of the multilayered structure wherein the plurality of path connection elements identified at each layer are included inside the embedded frame (220).

In this case, the embedded frame for each layer of the multilayered structure may be generated by placing each of the plurality of path connection elements identified in each layer at a corresponding position on a two-dimensional plane of each layer which is viewed from above in a perpendicular direction.

Specifically, FIG. 4 is a diagram illustrating an example of the embedded frame for each layer of a multilayered structure.

Referring to FIG. 4, the embedded frame 410 for Layer 1 of a multilayered structure includes the global path start point 411 included in Layer 1 and the puncture 412 corresponding to the link between Layer 1 and Layer 2. In this case, in the embedded frame 410, positions of the global path start point 411 and the puncture 412 may correspond to positions of the corresponding global path start point 411 and puncture 412 in Layer 1. Also, the global path start point 411 and the puncture 412 may be assigned coordinates that indicate their positions in the embedded frame 410.

The embedded frame 420 for Layer 2 of the multilayered structure includes the puncture 421 corresponding to the link between Layer 2 and Layer 3, and the puncture 422 corresponding to the link between Layer 1 and Layer 2. In this case, positions of the punctures 421 and 422 in the embedded frame 420 may correspond to positions of the corresponding punctures 421 and 422 in Layer 2. In addition, the punctures 421 and 422 may be assigned coordinates that indicate their positions in the embedded frame 420.

In addition, the embedded frame 430 for Layer 3 of the multilayered structure includes the puncture 431 corresponding to the link between Layer 2 and Layer 3 and the global path end point 432 included in Layer 3. In this case, positions of the puncture 431 and the global path end point 432 in the embedded frame 430 may correspond to positions of the corresponding puncture 431 and global path end point 432 in Layer 3. Moreover, the puncture 431 and the global path end point 432 may be assigned coordinates that indicate their positions in the embedded frame 430.

Referring back to FIG. 2, after generating the embedded frame for each layer of the multilayered structure, the computing device 12 generates the topological frame for each layer on the basis of the generated embedded frame (230).

The topological frame includes an outer boundary that surrounds all of the punctures included in the embedded frame and the local path points arranged on an outline of each of the one or more punctures. Also, in the case when global path points are included in a specific embedded frame, each of the global path points is arranged on the outer boundary of the topological frame.

Meanwhile, the local path points refer to points that are not global path points, but are still starting points and end points of partial paths of the global path that pass through each layer of the multilayered structure.

Specifically, in the example illustrated in FIG. 3, the global path 350 connecting the global path start point 310 and the global path end point 320 includes a partial path connecting the global path start point 310 and the puncture 331 formed on Layer 1; a partial path connecting the two punctures 332 and 341 formed on Layer 2; and a partial path connecting the puncture 342 formed on Layer 3 and the global path end point 320. In this case, based on the direction from the global path start point 310 to the global path end point 320, a point where the global path enters the puncture on each layer corresponds to a local path end point at which the partial path on each layer ends, and a point where the global path exits the puncture in each layer corresponds to a local path start point where a partial path on each layer starts.

FIGS. 5A to 5D are diagrams describing a process of generating the topological frame according to one embodiment.

Figure 5A:
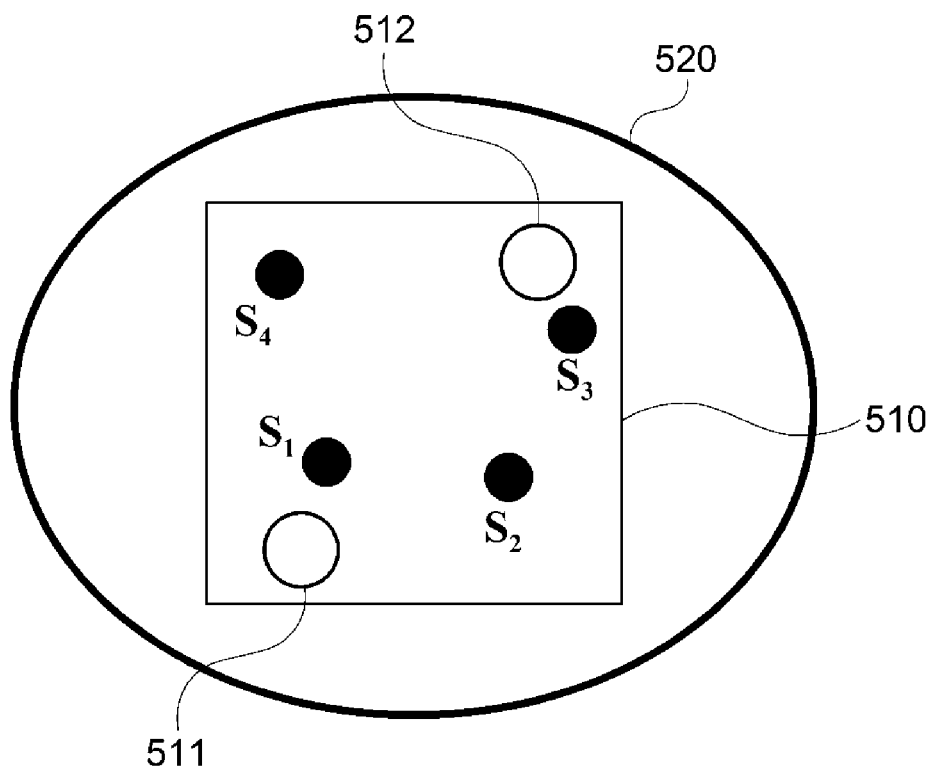
FIGS. 5A to 5D are diagrams describing a process of generating the topological frame according to one embodiment.
Figure 5B:
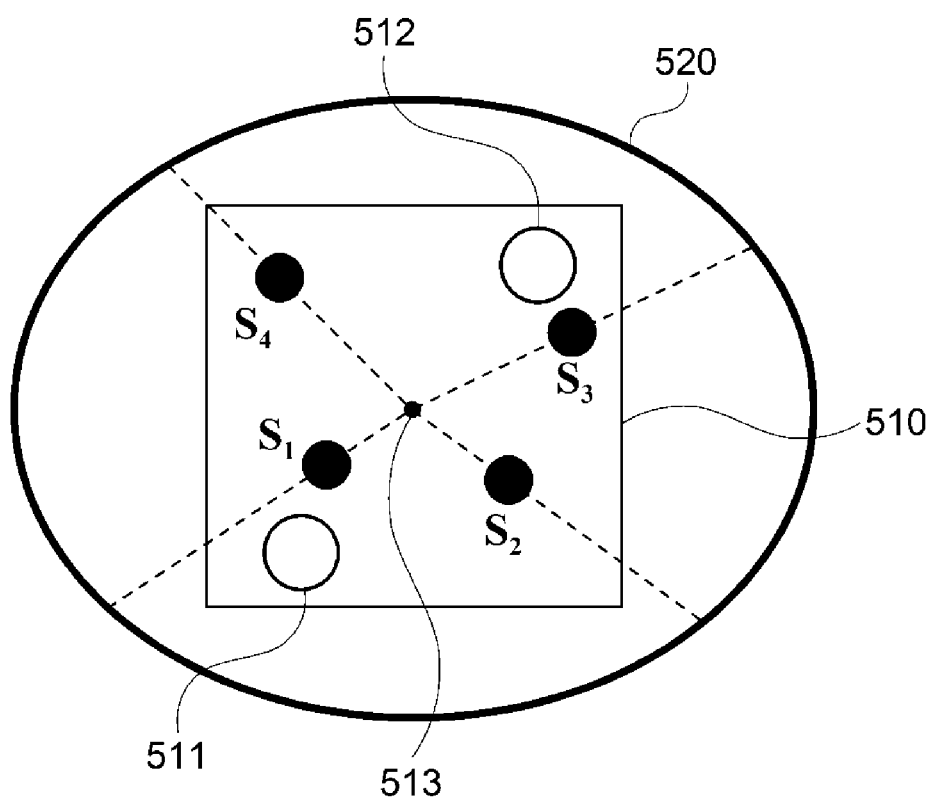
Figure 5C:
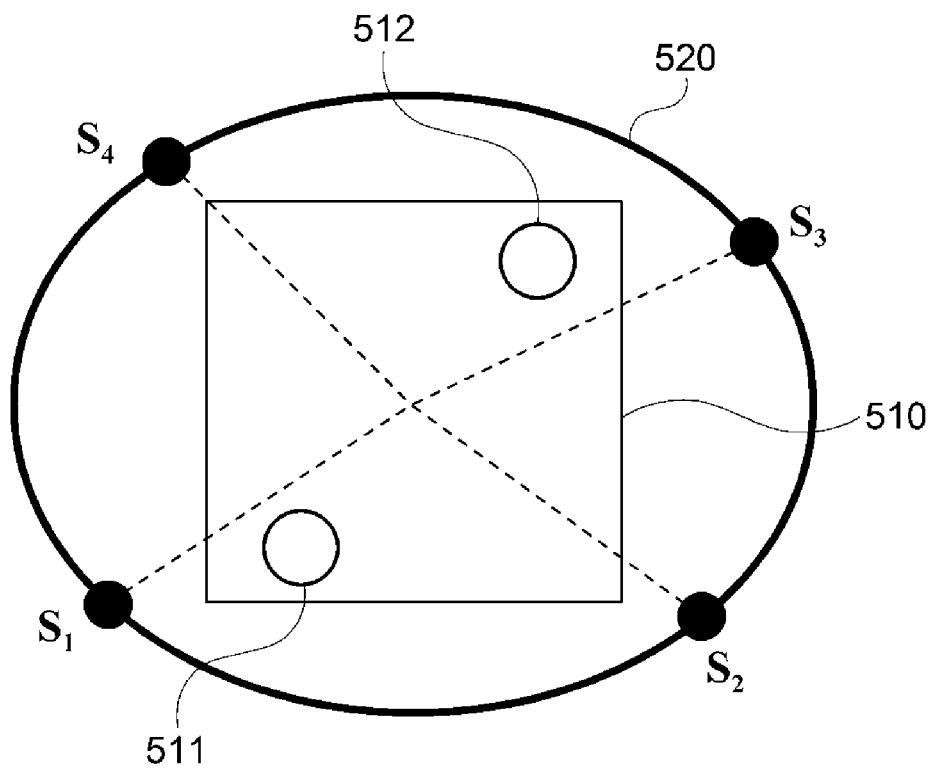

In FIGS. 5A to 5D, it is assumed that the embedded frame 510 includes four global path start points $S_1$, $S_2$, $S_3$, and $S_4$ and two punctures 511 and 512, but the types and number of path connection elements included in the embedded frame 510 are not necessarily limited to the examples illustrated in FIGS. 5A to 5C.

Referring to FIG. 5A, the computing device 12 may generate the outer boundary 520 that surrounds all of the path connection elements included in the embedded frame 510. Here, the outer boundary 520 may be in the form of a circular closed curve as shown in the example, but the shape of the outer boundary is not necessarily limited to a specific shape. Also, although in the illustrated example, the outer boundary 520 is illustrated as enclosing the whole embedded frame 510, the outer boundary 520 may be generated in various sizes according to embodiments as long as all of the path connection elements included in the embedded frame 510 can be surrounded by the outer boundary 520.

When global path points are included in the embedded frame 510, the computing device 12, after generating the outer boundary 520, may dispose each of the global path points on the outer boundary 520 by projecting it onto the outer boundary 520.

Specifically, referring to FIGS. 5B and 5C, the computing device 12 may set straight lines connecting an arbitrary point 513 inside the embedded frame 510 and each of the global path points $S_1$, $S_2$, $S_3$, and $S_4$ included in the embedded frame 510, as represented by dotted lines.

Then, the computing device 12 may allow each of the global path points $S_1$, $S_2$, $S_3$, and $S_4$ to be arranged on the outer boundary 520 by projecting each of the global path points $S_1$, $S_2$, $S_3$, and $S_4$ onto the outer boundary 520 along the set straight lines.

Figure 5D:
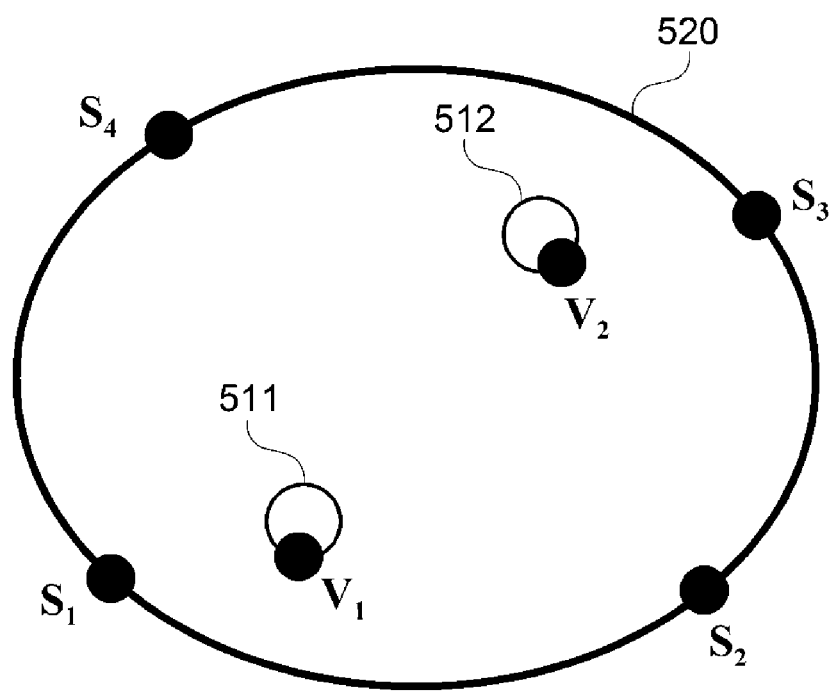

Referring to FIG. 5D, after projecting each of the global path points $S_1$, $S_2$, $S_3$, and $S_4$ onto the outer boundary 520, the computing device 12 may remove a boundary of the embedded frame 510 and arrange local path points $V_1$ and $V_2$ on a boundary of each of the punctures 511 and 512 to generate the topological frame. In this case, the positions of the local path points $V_1$ and $V_2$ on the boundary of each of the punctures 511 and 512 may be arbitrarily set and may be set in various ways according to embodiments.

Referring back to FIG. 2, after generating the topological frame for each layer of the multilayered structure, the computing device 12 merges the boundary of each of the one or more punctures included in the topological frame with the outer boundary of the topological frame to generate the circular frame which is configured as a single circular closed curve on which all path points (i.e., the global path points and/or the local path points) included in the topological frame are arranged (240).

Specifically, according to one embodiment, the computing device 12 may set one or more reference paths, each of which has one end connected to the boundary of one puncture included in the topological frame and the other end connected to the boundary of another puncture included in the topological frame or connected to the outer boundary of the topological frame. In addition, the computing device 12 may cut the topological frame along the one or more set reference paths such that the boundary of each of the one or more punctures included in the topological frame and the outer boundary of the topological frame are merged into a single circular closed curve. At this time, the one or more reference paths may each be transformed into a pair of reference points arranged on the circular closed curve of the circular frame.

Figure 6A:
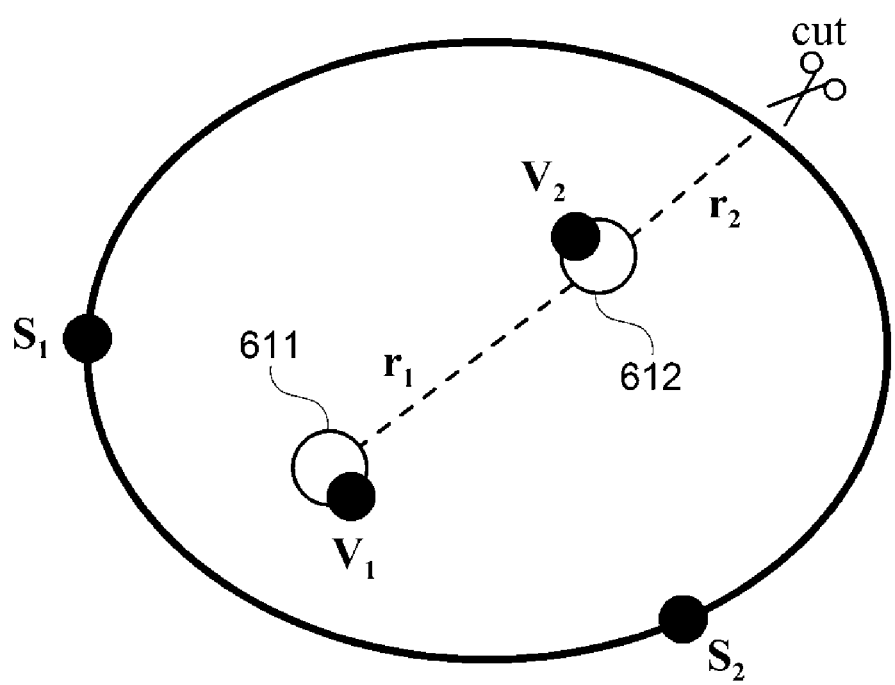
FIGS. 6A to 6C are diagrams illustrating a process of generating the circular frame according to one embodiment.
Figure 6B:
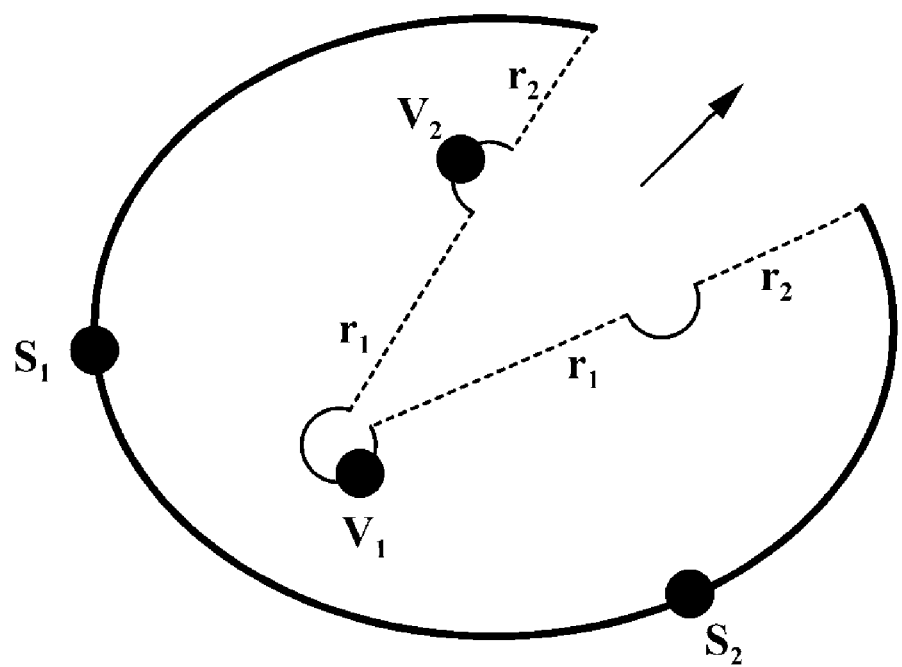
Figure 6C:
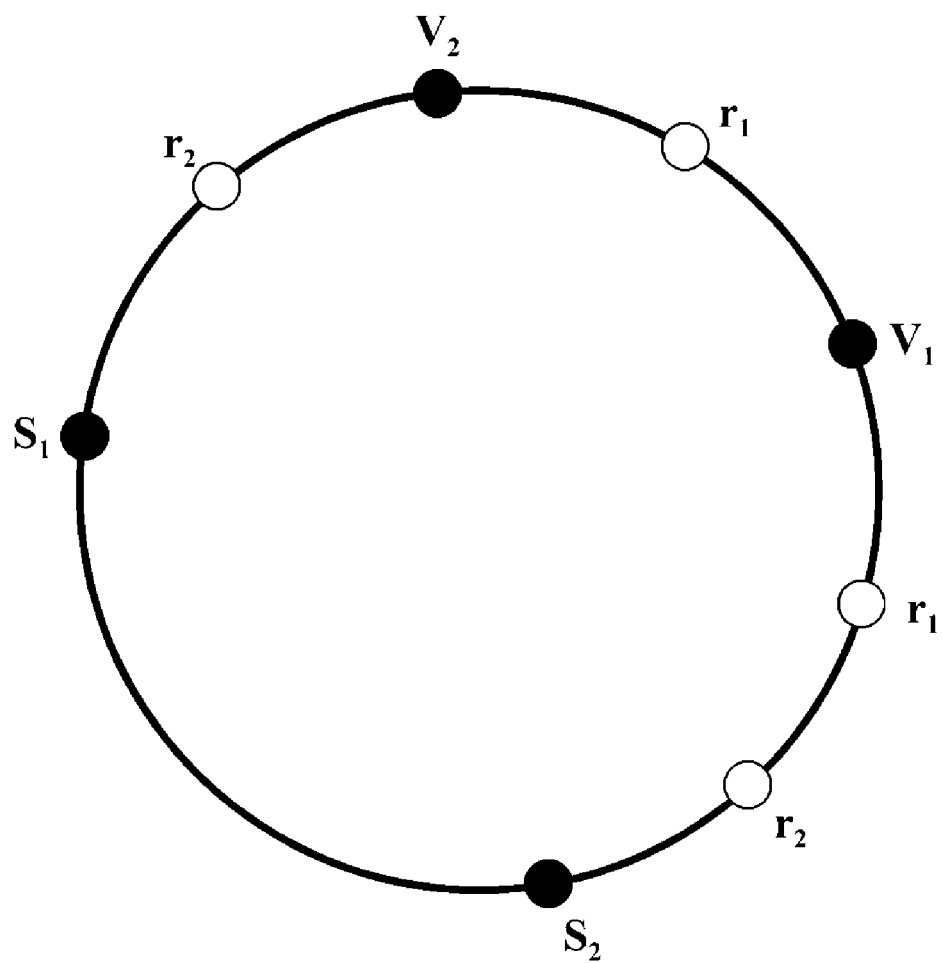

FIGS. 6A to 6C are diagrams illustrating a process of generating the circular frame according to one embodiment.

Referring to FIG. 6A, the computing device 12 may set one reference path $r_1$ that connects boundaries of two punctures 611 and 612 included inside a topological frame and another reference path $r_2$ that connects the outer boundary of the topological frame and one puncture 612.

Then, the computing device 12 may generate the circular frame as shown in the example of FIG. 6C by cutting the topological frame along each of the reference paths $r_1$ and $r_2$ and opening the cut lines as shown in the example of FIG. 6B.

When the topological frame is cut along each of the reference paths $r_1$ and $r_2$, each of the reference paths $r_1$ and $r_2$ is divided into two lines as shown in the example of FIG. 6B, and the computing device 12 may generate reference points $r_1$ and $r_2$ at positions on the circular closed curve corresponding to each of the two lines divided from each of the reference paths $r_1$ and $r_2$ as shown in the example of FIG. 6C.

Figure 7A:
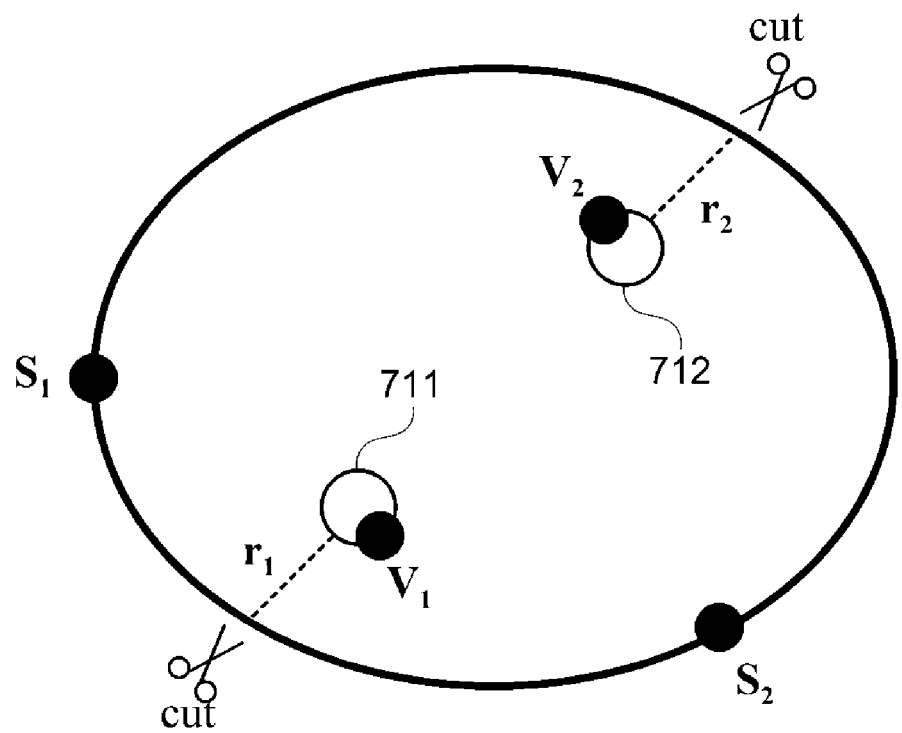
FIGS. 7A to 7C are diagrams illustrating a process of generating the circular frame according to another embodiment.
Figure 7B:
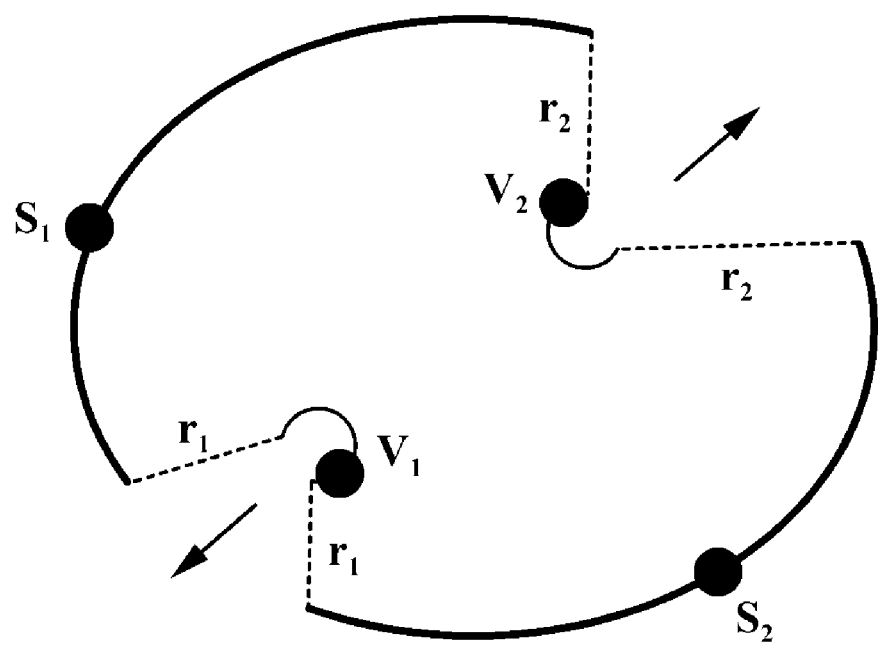
Figure 7C:
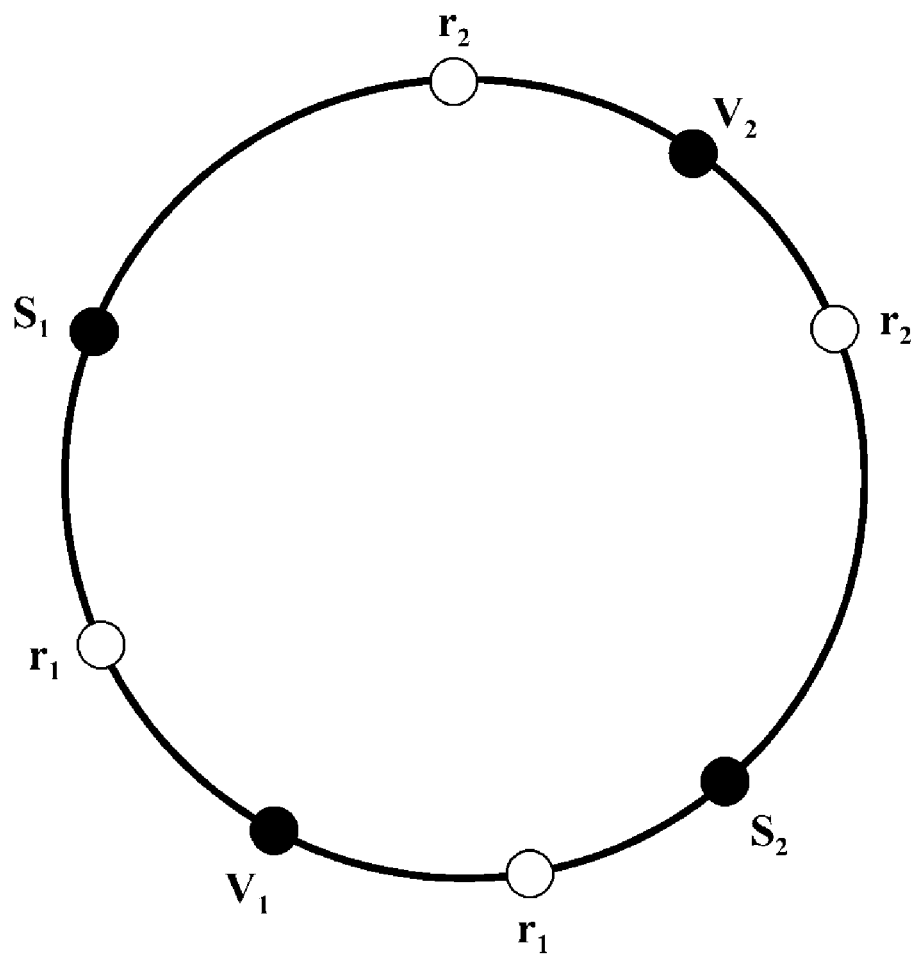

FIGS. 7A to 7C are diagrams illustrating a process of generating the circular frame according to another embodiment.

Referring to FIG. 7A, where two punctures 711 and 712 are included in the interior of the topological frame, the computing device 12 may generate one reference path $r_1$ that connects the boundary of one puncture 711 and the outer boundary of the topological frame and another reference path $r_2$ that connects the boundary of another puncture 712 and the outer boundary of the topological frame.

Then, the computing device 12 may generate the circular frame as shown in the example of FIG. 7C by cutting the topological frame along each of the reference paths $r_1$ and $r_2$ and opening the cut lines as shown in the example of FIG. 7B.

When the topological frame is cut along each of the reference paths $r_1$ and $r_2$, each of the reference paths $r_1$ and $r_2$ is divided into two lines as shown in the example of FIG. 7B, and the computing device 12 may generate reference points $r_1$ and $r_2$ on the circular closed curve corresponding to each of the two lines originating from each of the reference paths $r_1$ and $r_2$ as shown in the example of FIG. 7C.

Figure 8A:
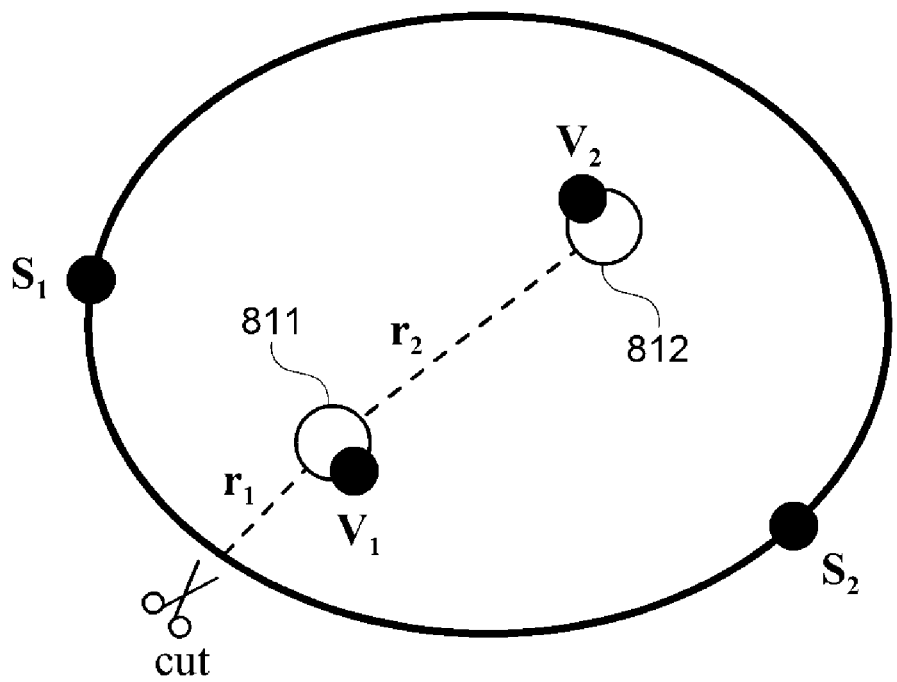
FIGS. 8A to 8C are diagrams illustrating a process of generating the circular frame according to another embodiment.
Figure 8B:
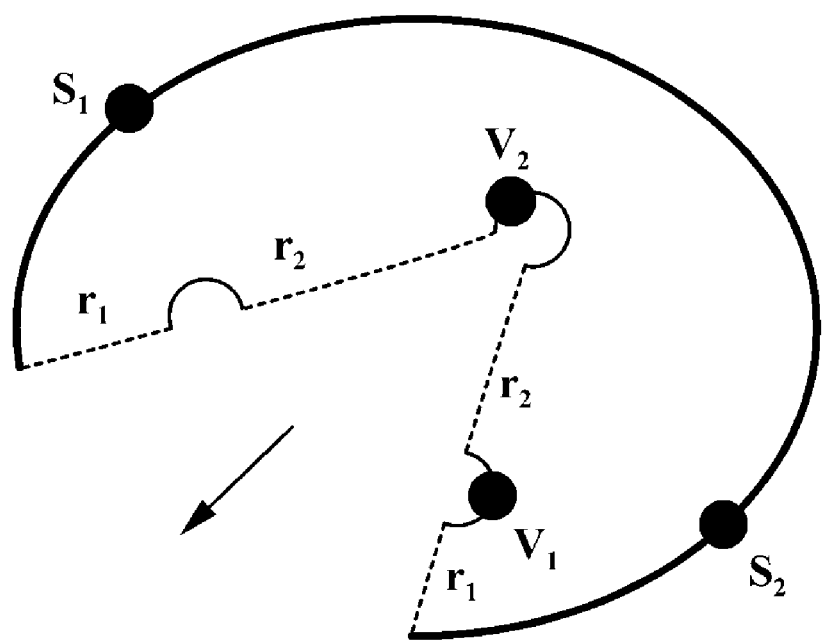
Figure 8C:
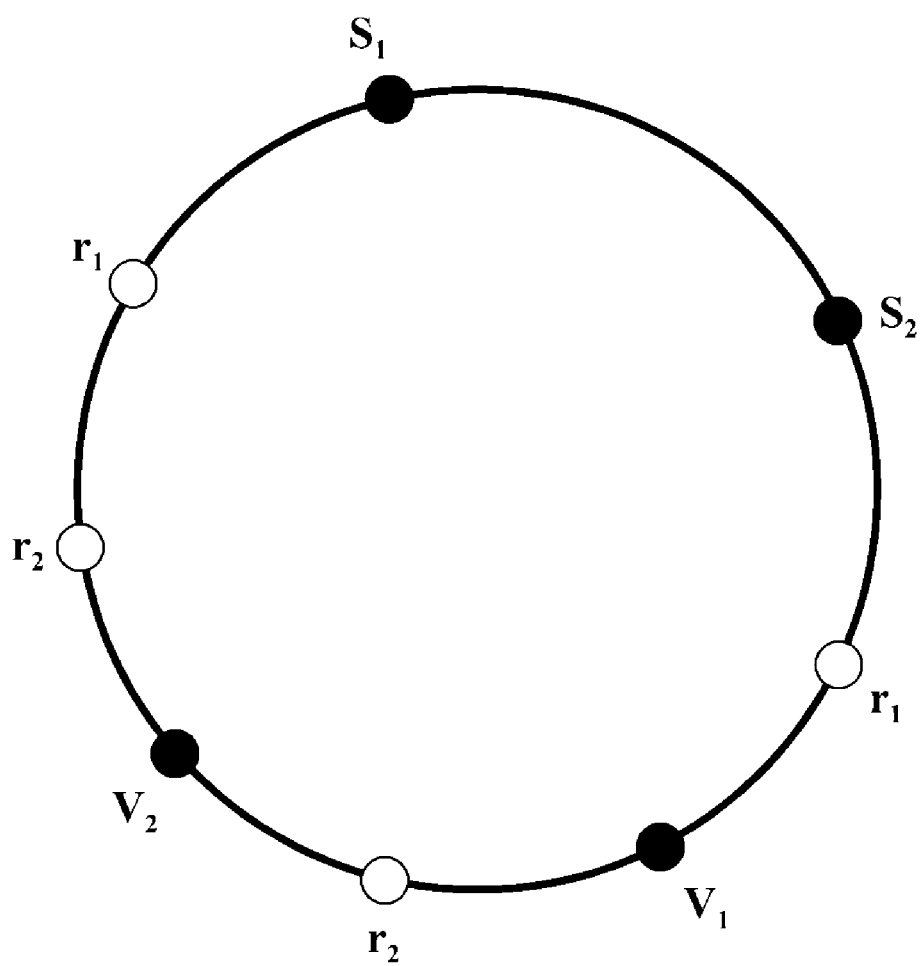

FIGS. 8A to 8C are diagrams illustrating a process of generating the circular frame according to another embodiment.

Referring to FIG. 8A, where two punctures 811 and 812 are included in the interior of the topological frame, the computing device 12 may generate one reference path $r_1$ that connects the boundary of the puncture 811 and the outer boundary of the topological frame and another reference path $r_2$ that connects boundaries of two punctures 811 and 812.

Then, the computing device 12 may generate a circular frame as shown in the example of FIG. 8C by cutting the topological frame along each of the reference paths $r_1$ and $r_2$ and opening the cut lines as shown in the example of FIG. 8B.

When the topological frame is cut along each of the reference paths $r_1$ and $r_2$, each of the reference paths $r_1$ and $r_2$ is divided into two lines as shown in the example of FIG. 8B, and the computing device 12 may generate reference points $r_1$ and $r_2$ on the circular closed curve corresponding to each of the two lines originating from each of the reference paths $r_1$ and $r_2$ as shown in the example of FIG. 8C.

Figure 9:
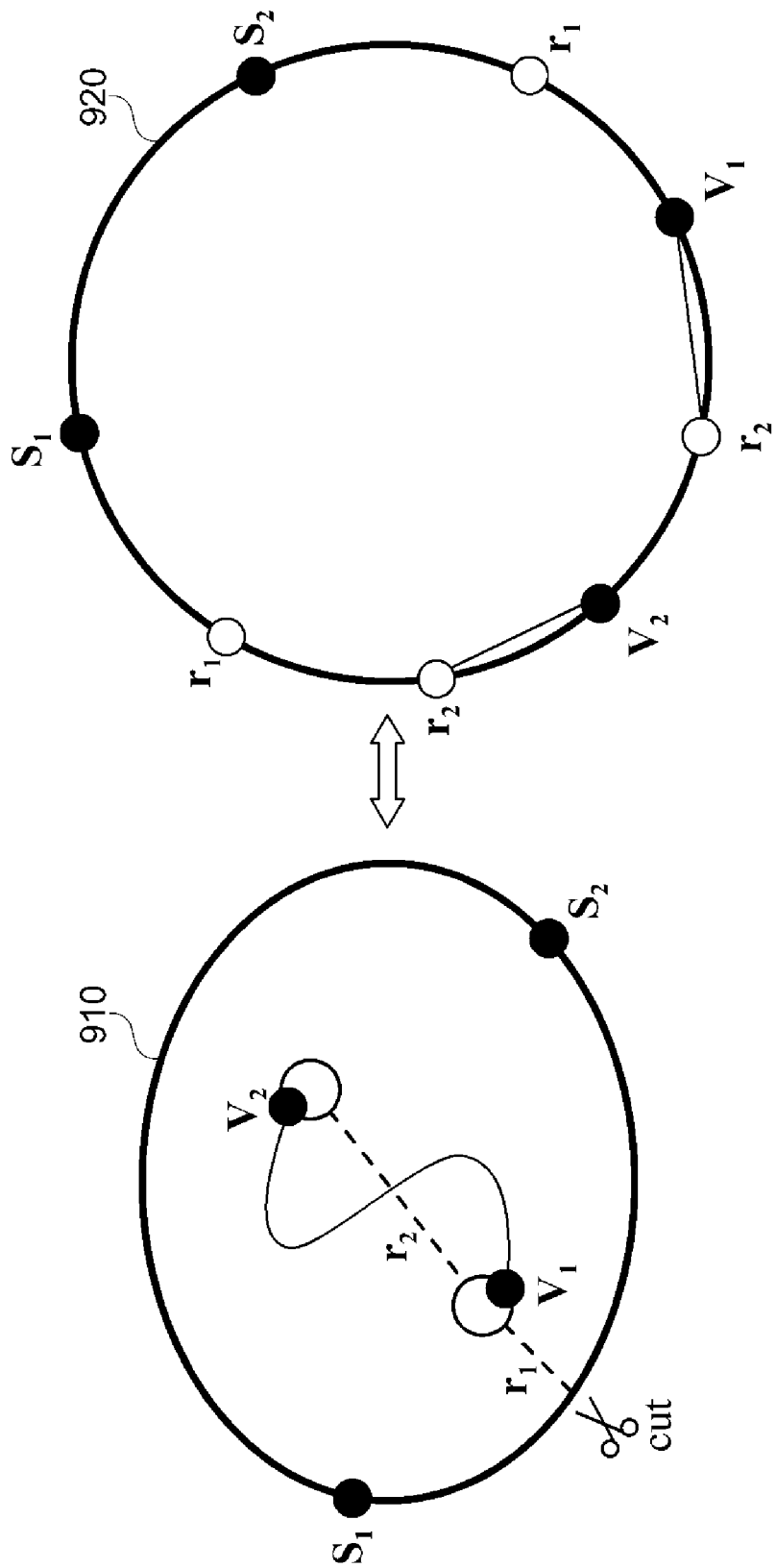
FIGS. 9 and 10 are diagrams describing the relationship between paths on the topological frame and paths on the circular frame according to one embodiment.

Referring to FIG. 9, a path that intersects the reference path $r_2$ on the topological frame and connects two local path points $V_1$ and $V_2$ may be transformed into straight lines between each of the reference points $r_2$ and each of the two local path points $V_1$ and $V_2$ on the circular frame 920 for the corresponding topological frame 910.

Figure 10:
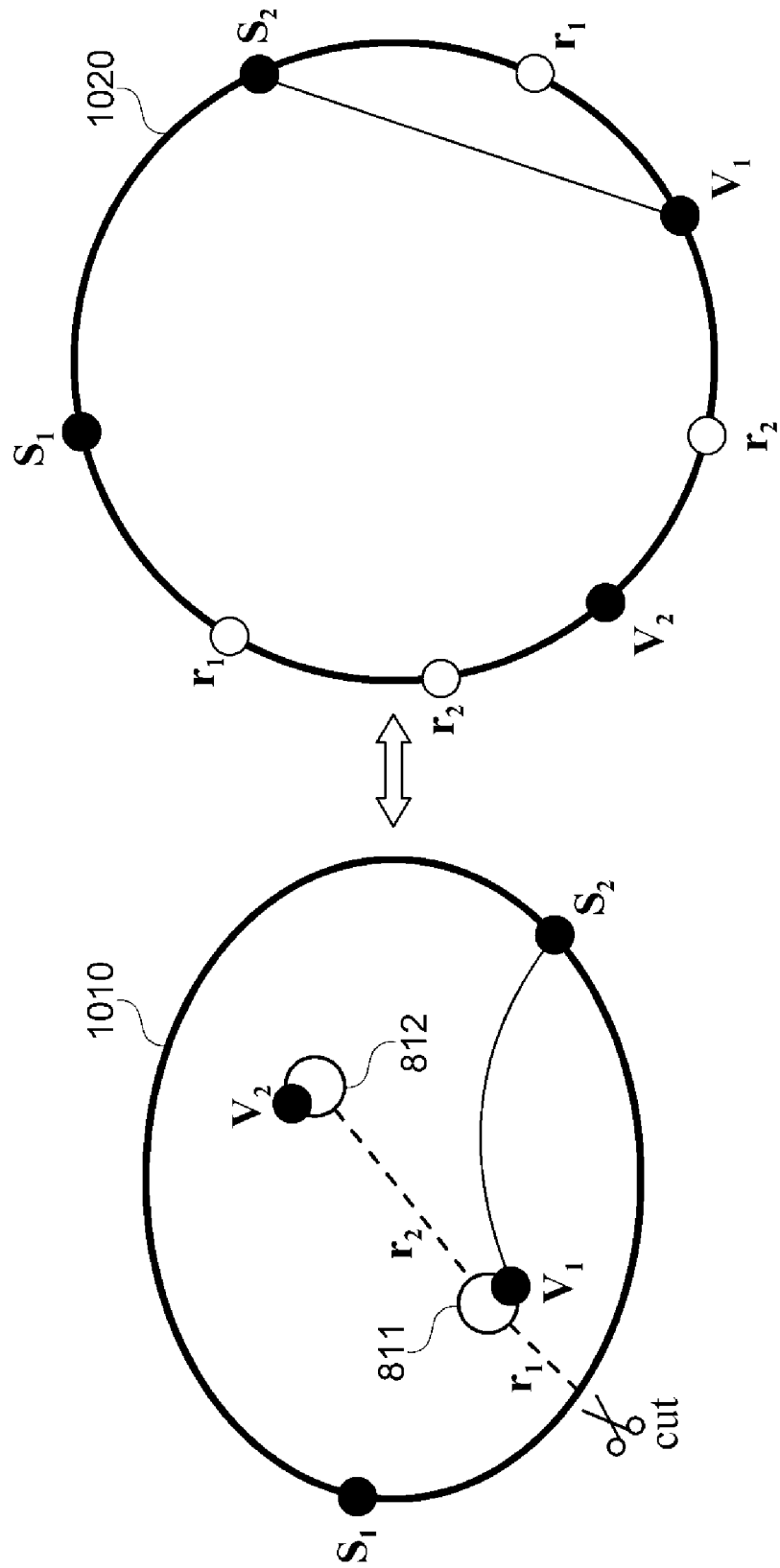

In addition, referring to FIG. 10, a path that does not intersect reference paths $r_1$ and $r_2$ on the topological frame 1010 and connects two path points $S_2$ and $V_1$ may be transformed into one straight line that connects the two path points $S_2$ and $V_1$ on a circular frame 1020 for the corresponding topological frame 1010.

That is, as can be seen in FIGS. 9 and 10, in the circular frame 920 for each layer of the multilayered structure, a problem of finding a path in each layer may be simplified to a problem of connecting a straight line between points arranged on the circular closed curve of the circular frame 920.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The invention claimed is:

1. A method of path routing in a multilayered structure representing a three-dimensional physical structure comprising a plurality of layers and one or more links formed between adjacent layers, which is performed on a computing device comprising one or more processors and a memory storing one or more programs that can be executed by the one or more processors, the method comprising:
   identifying a plurality of path connection elements included in each layer of the multilayered structure, the plurality of path connection elements of said each layer comprising one or more punctures formed by the one or more links each of which is a connecting passage passing through two adjacent layers and one or more local path points arranged on a boundary of each of the one or more punctures;
   generating, for each layer of the multilayered structure, an embedded frame by placing each of the plurality of path connection elements identified in each layer of the multilayered structure at a corresponding position on a two-dimensional plane of the each layer which is viewed from above in a perpendicular direction;
   generating, for each layer of the multilayered structure, a topological frame by generating an outer boundary enclosing the one or more punctures and projecting the one or more global path points onto the outer boundary; and
   generating, for each layer of the multilayered structure, a circular frame comprised of a circular closed curve on which the plurality of path connection elements including one or more global path points and the one or more local path points are arranged by merging the boundary of each of the one or more punctures and the outer boundary of the topological frame, wherein the generating of the circular frame comprises:
      setting, on the topological frame, one or more reference paths, each of which has one end connected to a boundary of one of the one or more punctures and the other end connected to a boundary of another puncture or to the outer boundary of the topological frame, with a proviso that at least one of the one or more reference paths has at least one end connected to the outer boundary of the topological frame; and
      merging the boundary of each of the one or more punctures and the outer boundary of the topological frame into the circular closed curve by cutting the topological frame along the one or more reference paths.

2. The method of claim 1, wherein the projecting of the one or more global path points comprises setting one or more straight lines connecting an arbitrary point in an interior of the embedded frame and each of the one or more global path points and projecting the one or more global path points along the one or more straight lines onto the outer boundary.

3. The method of claim 1, wherein the one or more global path points and the one or more local path points are each arranged on the circular closed curve.

4. The method of claim 1, wherein the circular frame includes a pair of reference points each of which corresponds to each of the one or more reference paths and is arranged on the circular closed curve.

5. The method of claim 1, wherein the multilayered structure is a printed circuit board (PCB).

6. The method of claim 1, wherein the multilayered structure is a semiconductor chip.

7. A computing device comprising:
   one or more processors; and
   a memory storing one or more programs that can be executed by the one or more processors,
   wherein the programs include commands to perform operations comprising:
      identifying a plurality of path connection elements included in each layer of a multilayered structure representing a three-dimensional physical structure comprising a plurality of layers and one or more links formed between adjacent layers, the plurality of path connection elements of said each layer comprising one or more punctures formed by the one or more links each of which is a connecting passage passing through two adjacent layers and one or more local path points arranged on a boundary of each of the one or more punctures;
      generating, for each layer of the multilayered structure, an embedded frame by placing each of the plurality of path connection elements identified in each layer of the multilayered structure at a corresponding position on a two-dimensional plane of the each layer which is viewed from above in a perpendicular direction;
      generating, for each layer of the multilayered structure, a topological frame by generating an outer boundary enclosing the one or more punctures and projecting the one or more global path points onto the outer boundary; and
      generating, for each layer of the multilayered structure, a circular frame comprised of a circular closed curve on which the plurality of path connection elements including one or more global path points and the one or more local path points are arranged by merging the boundary of each of the one or more punctures and the outer boundary of the topological frame, wherein the generating of the circular frame comprises:
         setting, on the topological frame, one or more reference paths, each of which has one end connected to a boundary of one of the one or more punctures and the other end connected to a boundary of another puncture or to the outer boundary of the topological frame, with a proviso that at least one of the one or more reference paths has at least one end connected to the outer boundary of the topological frame; and
         merging the boundary of each of the one or more punctures and the outer boundary of the topological frame into the circular closed curve by cutting the topological frame along the one or more reference paths.

8. The computing device of claim 7, wherein the projecting of the one or more global path points comprises setting one or more straight lines connecting an arbitrary point in an interior of the embedded frame and each of the one or more global path points and projecting the one or more global path points along the one or more straight lines onto the outer boundary.

9. The computing device of claim 7, wherein the one or more global path points and the one or more local path points are each arranged on the circular closed curve.

10. The computing device of claim 7, wherein the circular frame includes a pair of reference points each of which corresponds to each of the one or more reference paths and is arranged on the circular closed curve.

11. A method of path routing in a multilayered structure representing a three-dimensional physical structure, which is performed on a computing device comprising one or more processors and a memory storing one or more programs that can be executed by the one or more processors, the method comprising:

identifying, by the computing device, a plurality of path connection elements included in each layer of a multilayered structure including a plurality of layers and one or more links formed between adjacent layers, the plurality of path connection elements of said each layer comprising one or more punctures formed by the one or more links and one or more local path points arranged on a boundary of each of the one or more punctures;

generating, for each layer of the multilayered structure, an embedded frame by placing each of the plurality of path connection elements identified in each layer of the multilayered structure at a corresponding position on a two-dimensional plane of the each layer which is viewed from above in a perpendicular direction by the computing device;

generating, for each layer of the multilayered structure, a topological frame by generating an outer boundary enclosing the one or more punctures and projecting the one or more global path points onto the outer boundary, by the computing device; and generating, for each layer of the multilayered structure, a circular frame comprised of a circular closed curve on which the plurality of path connection elements are arranged by merging the boundary of each of the one or more punctures and the outer boundary of the topological frame, the generating of the circular frame comprising:

setting, on the topological frame, one or more reference paths, each of which has one end connected to a boundary of one of the one or more punctures and the other end connected to a boundary of another puncture or to the outer boundary of the topological frame, with a proviso that at least one of the one or more reference paths has at least one end connected to the outer boundary of the topological frame; and cutting the topological frame along the one or more reference paths to merge the boundary of each of the one or more punctures and the outer boundary of the topological frame into the circular closed curve on which the plurality of path connection elements are each arranged and each of the one or more reference paths are arranged as a pair of reference points.

12. The method of claim 11, wherein the multilayered structure is a printed circuit board (PCB).

13. The method of claim 11, wherein the multilayered structure is a semiconductor chip.

* * * * *